United States Patent
Wang et al.

(10) Patent No.: US 11,264,101 B2
(45) Date of Patent: *Mar. 1, 2022

(54) METHOD OF PROGRAMMING IN FLASH MEMORY DEVICES

(71) Applicant: YANGTZE MEMORY TECHNOLOGIES CO., LTD., Wuhan (CN)

(72) Inventors: Yu Wang, Wuhan (CN); Shuang Li, Wuhan (CN); Khanh Nguyen, Wuhan (CN); Chunyuan Hou, Wuhan (CN); Qiang Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/172,086

(22) Filed: Feb. 10, 2021

(65) Prior Publication Data

US 2021/0166766 A1 Jun. 3, 2021

Related U.S. Application Data

(63) Continuation of application No. 16/660,773, filed on Oct. 22, 2019, now Pat. No. 10,943,663, which is a
(Continued)

(51) Int. Cl.
*G11C 7/00* (2006.01)
*G11C 16/12* (2006.01)
(Continued)

(52) U.S. Cl.
CPC .......... *G11C 16/12* (2013.01); *G11C 11/5628* (2013.01); *G11C 16/08* (2013.01); *G11C 16/3459* (2013.01)

(58) Field of Classification Search
CPC .............. G11C 11/161; G11C 11/5628; G11C 16/0483; G11C 16/08; G11C 16/10;
(Continued)

(56) References Cited

U.S. PATENT DOCUMENTS 6,330,189 B1  12/2001 Sakui
6,605,512 B2   8/2003 Kiyota
(Continued)

FOREIGN PATENT DOCUMENTS

CN  101388248 A  3/2009
CN  101414483 A  4/2009
(Continued)

*Primary Examiner* — Hien N Nguyen
(74) *Attorney, Agent, or Firm* — Bayes PLLC

(57) ABSTRACT

A memory device includes a plurality of memory cells. Each row of the plurality of memory cells is coupled to a respective one of a plurality of wordlines. A method of programming the memory device includes applying a program voltage to a selected wordline of the plurality of wordlines. The method also includes applying a series of incremental verifying voltages to the selected wordline in a first time period after applying the program voltage. The method further includes floating an unselected wordline of the plurality of wordlines in a second time period at least partially overlapping the first time period. The unselected wordline is adjacent to the selected wordline.

20 Claims, 9 Drawing Sheets

Related U.S. Application Data continuation of application No. PCT/CN2019/102969, filed on Aug. 28, 2019.

(51) Int. Cl.
  *G11C 11/56* (2006.01)
  *G11C 16/08* (2006.01)
  *G11C 16/34* (2006.01)

(58) Field of Classification Search
  CPC ... G11C 16/24; G11C 16/3459; G11C 29/023; G11C 29/028; G11C 7/222
  See application file for complete search history.

(56) References Cited

U.S. PATENT DOCUMENTS

| | | |
|---|---|---|
| 6,811,075 B2 | 11/2004 | Sloot |
| 7,778,083 B2 | 8/2010 | Moon |
| 7,848,150 B2 | 12/2010 | Lee |
| 8,027,202 B2 | 9/2011 | Lee |
| 9,318,202 B2 | 4/2016 | Nam |
| 9,589,660 B1 | 3/2017 | Hashimoto |
| 9,653,168 B2 | 5/2017 | Kim |
| 10,573,386 B2 | 2/2020 | Kim |
| 10,943,663 B1 * | 3/2021 | Wang .................. G11C 11/5628 |
| 2009/0067257 A1 | 3/2009 | Lee et al. |
| 2009/0219765 A1 | 9/2009 | Maejima |
| 2009/0285026 A1 | 11/2009 | Kang |
| 2014/0313823 A1 | 10/2014 | Kim |

FOREIGN PATENT DOCUMENTS

| | | |
|---|---|---|
| CN | 101556827 A | 10/2009 |
| CN | 104160449 B | 2/2017 |
| CN | 108986861 A | 12/2017 |
| CN | 109308929 A | 2/2019 |
| CN | 109658964 A | 4/2019 |
| TW | 563241 | 11/2003 |
| TW | 201145291 A1 | 12/2011 |
| TW | 201342377 A | 10/2013 |
| TW | I606577 B | 11/2017 |

* cited by examiner

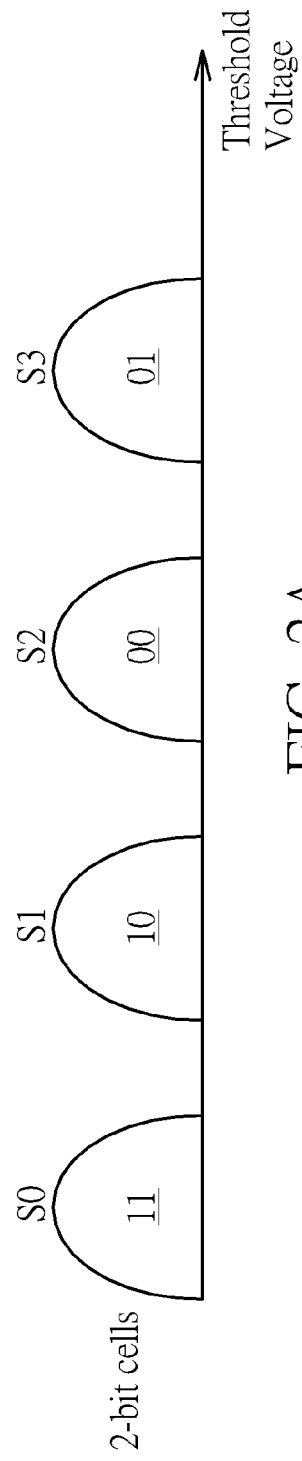
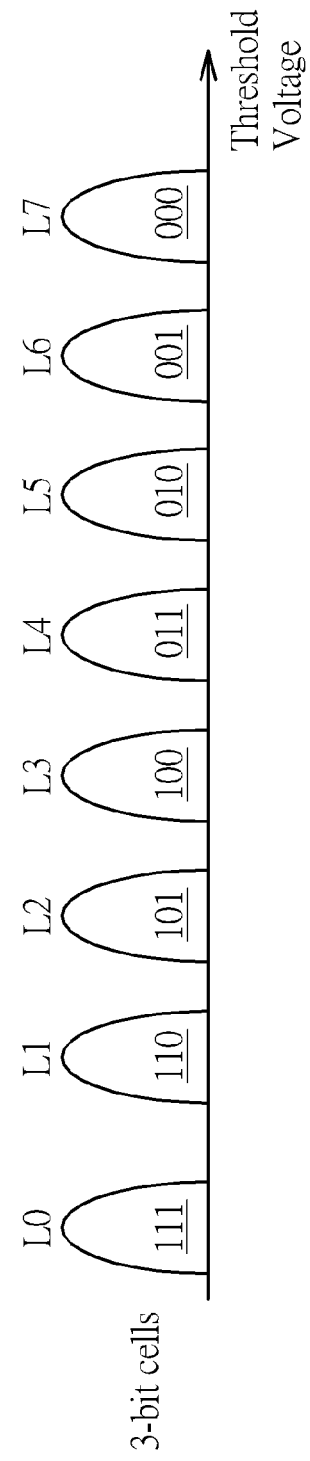
FIG. 2A
FIG. 2B 2-bit cells 3-bit cells

METHOD OF PROGRAMMING IN FLASH MEMORY DEVICES

CROSS-REFERENCE TO RELATED APPLICATIONS

This application is a continuation of U.S. application Ser. No. 16/660,773, filed on Oct. 22, 2019, which is a continuation of International Application No. PCT/CN2019/102969, filed on Aug. 28, 2019, both of which are incorporated herein by reference in their entireties.

BACKGROUND

The present disclosure is related to flash memory devices, and more particularly, to programming methods in flash memory devices.

A non-volatile memory is a memory that can retain its stored data for an extended period without the application of power. Flash memory devices have developed into a popular type of non-volatile memory for a wide range of applications. Flash memory devices are commonly used in electronic systems, such as personal computers, digital cameras, digital media players, digital recorders, vehicles, wireless devices, cellular phones, and removable memory modules, and the uses for flash memory continue to expand.

A flash memory uses one of the two basic architectures known as NOR Flash and NAND Flash. Typically, an array of memory cells for NAND flash memory devices is arranged such that memory cells of a string are connected together in series, source to drain. A flash memory can comprise a memory array, which includes a large number of floating gate transistors. A NAND architecture array arranges its array of flash memory cells in a matrix of rows and columns, as a conventional NOR array does, so that the gates of each flash memory cell of the array are coupled by rows to word lines. However, unlike NOR, each memory cell is not directly coupled to a source line and a column bitline. Instead, the memory cells of the array are arranged together in strings, typically of 8, 16, 32, or more. The memory cells in the string are coupled together in series, source to drain, between a common source line and a column bitline.

Some flash memories are designed to store more than one bit of data per memory cell. Flash memories that store more than one bit of data per memory cell are referred to as multilevel cell (MLC) flash memories. MLC flash memories are typically programmed by using incremental step pulse programming (ISPP). In incremental step pulse programming, selected memory cells are programmed by multiple of programming loops, where each programming loop comprises a programming operation where a program voltage is applied to a selected memory cell to modify its state, and a verification operation where a verifying voltage is applied to the selected memory cell to determine whether it has reached a target state. By performing programming loops in this manner, selected memory cells are programmed gradually and can avoid certain programming errors such as over-programming.

SUMMARY

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, applying a floating voltage to a second wordline of the plurality of wordlines. The second wordline being adjacent to the selected wordline is programmed after the selected wordline.

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, after applying the pre-pulse voltage, discharging a second wordline of the plurality of wordlines to a system voltage level, and after discharging the second wordline to the system voltage level, applying a floating voltage to the second wordline. The second wordline being adjacent to the selected wordline is programmed after the selected wordline.

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, discharging a second wordline of the plurality of wordlines to a ground voltage level, and after discharging the second wordline to the ground voltage level, applying a floating voltage to the second wordline. The second wordline being adjacent to the selected wordline is programmed after the selected wordline.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 2A is a diagram of an example of threshold voltage ranges of 2-bit MLC memory cells.

FIG. 2B is a diagram of an example of threshold voltage ranges of 3-bit MLC memory cells.

DETAILED DESCRIPTION

Figure 1:
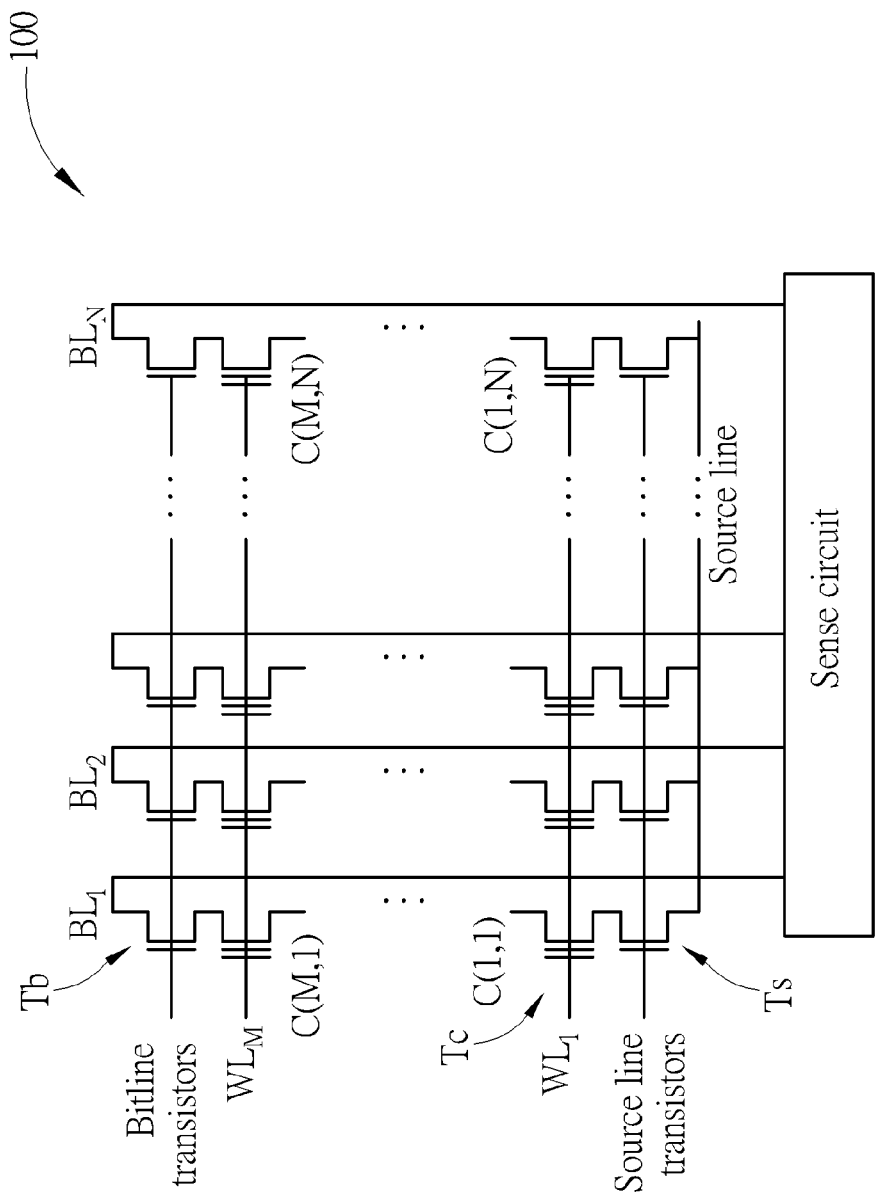
FIG. 1 is a diagram of a flash memory device implemented in an embodiment.

FIG. 1 shows a flash memory device 100 of an embodiment of the present disclosure. The flash memory device 100 includes a plurality of memory cells C(1,1) to C(M,N), where M and N are positive integers. In some embodiments of the present disclosure, the non-volatile memory device 100 can be a NAND type flash memory. N memory cells can be coupled to the same wordline, and M memory cells can be coupled to the same bitline. For example, a row of memory cells C(1,1) to C(1,N) can be coupled to a wordline $WL_1$, and a row of memory cells C(M,1) to C(M,N) can be coupled to a wordline $WL_M$. A column of memory cells C(1,1) to C(M,1) can be coupled to a bitline $BL_1$, and a column of memory cells C(M,1) to C(M,N) can be coupled to a bitline $BL_N$. One terminal of a memory column is coupled to a bitline via a bitline transistor Tb corresponding to that memory column and the other terminal is coupled to a source line via a source line transistor Ts. The bitlines $BL_1$ to $BL_N$ are coupled to sense circuits (e.g., sense amplifier) 300 that detect the state of a target memory cell by sensing voltage or current on a selected bitline $BL_n$, where n is a positive integer between 1 and N inclusively. The flash memory device 100 further includes a control circuit (not shown in the figure) for implementing programming pulses to the memory cell array.

Memory cells C(1,1) to C(M,N) can be configured as single level memory cells (SLC) or multilevel memory cells (MLC). A data state is assigned to a memory cell with a specific range of threshold voltages stored in the memory cell. SLC allows a data of single binary digit in one memory cell, while MLC allows two or more binary digits to be stored in one memory cell depending on the range and tightness of the threshold voltage. For example, one bit may be represented by two threshold voltage ranges, two bits by four ranges, and three bits by eight ranges . . . etc. SLC memory uses two threshold voltage ranges to store a single bit of data (two ranges), representing 0 or 1. MLC memory can be configured to store two bits of data (four ranges), three bits of data (eight ranges), or more.

FIG. 2A is a diagram of an example of threshold voltage ranges of 2-bit MLC memory cells. A memory cell might be programmed to a threshold voltage that falls within one of four different ranges S0, S1, S2, and S3; each represents a data state corresponding to a pattern of two bits. A margin is maintained between each range S0 to S3 to prevent overlapping. For example, if the voltage of a memory cell falls within the first threshold voltage range S0, the cell stores a "11" state, which usually represents an erased state. If the voltage of a memory cell falls within the second threshold voltage range S1, the cell stores a "10" state. If the voltage of a memory cell falls within the third threshold voltage range S2, the cell stores a "00" state. If the voltage of a memory cell falls within the fourth threshold voltage range S3, the cell stores a "01" state.

FIG. 2B is a diagram of an example of threshold voltage ranges of 3-bit MLC memory cells. A memory cell might be programmed to a threshold voltage that falls within one of four different ranges L0, L1, L2, L3, L4, L5, L6, and L7; each represents a data state corresponding to a pattern of three bits. For example, if the voltage of a memory cell falls within the first threshold voltage range L0, the cell stores a "111" state, which usually represents an erased state. If the voltage of a memory cell falls within the second threshold voltage range L1, the cell stores a "110" state. If the voltage of a memory cell falls within the third threshold voltage range L2, the cell stores a "101" state. If the voltage of a memory cell falls within the fourth threshold voltage range L3, the cell stores a "100" state. If the voltage of a memory cell falls within the fifth threshold voltage range L4, the cell stores a "011" state. If the voltage of a memory cell falls within the sixth threshold voltage range L5, the cell stores a "010" state. If the voltage of a memory cell falls within the seventh threshold voltage range L6, the cell stores a "001" state. If the voltage of a memory cell falls within the eighth threshold voltage range L7, the cell stores a "000" state.

Flash programming involves applying one or more programming pulses to a wordline, for example, wordline $WL_m$ in FIG. 1, where m is an integer between 1 and M. This is to control the gate of each memory cell C(m,1) to C(m,N). For example, programming pulses may start at 15V and increase for each subsequent programming pulse. This programming method is commonly known incremental step pulse programming (ISPP). While a programming pulse is applied to the wordline $WL_m$, a voltage is also applied to the substrate having the channels of these memory cells resulting in a charge transfer from the channel to the floating gates of the selected memory cells. Electrons from the channels can be injected into the floating gates through direct injection or Fowler-Nordheim tunneling. Therefore, in a programmed state, the threshold voltage is usually greater than zero.

Figure 3A:
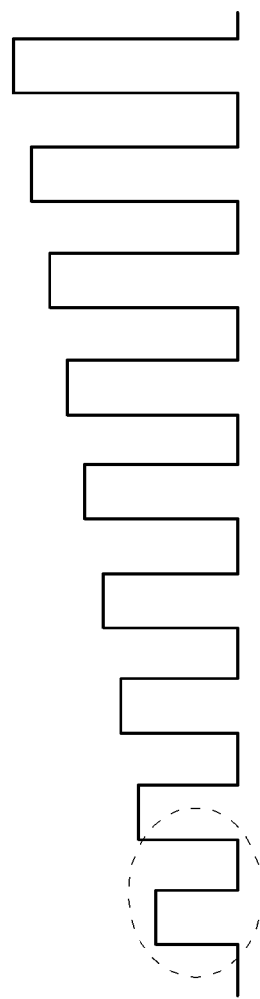
FIGS. 3A, 3B and 3C are diagrams illustrating incremental step pulse programming (ISPP) scheme used to program the selected memory cells.

FIG. 3A is a diagram further illustrating the incremental step pulse programming (ISPP) scheme used to program the selected memory cells. The example of FIG. 3A is a general ISPP scheme. A program voltage of the programming pulses is applied to control the gates of the selected memory cells. The level of the program voltage of the programming pulses increases in each successive loop.

Figure 3B:
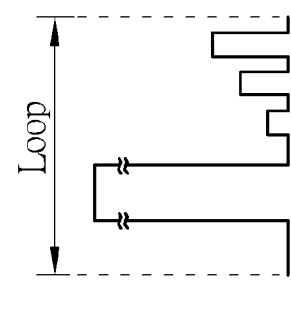
Figure 3C:
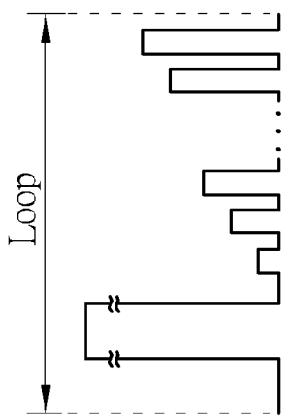

Between the programming pulses, a verification operation is performed to check the selected memory cells to determine whether they have reached their target programming state. In FIG. 3B, in a 2-bit MLC memory cell, verification operations are performed using a series of three increasing verifying voltages to determine whether a selected memory cell such as C(m,n) has been successfully programmed to a state corresponding to one of threshold voltage distributions S0 through S3 in FIG. 2A (e.g., the target state). Similarly, in FIG. 3C, verification operations for a 3-bit MLC memory cell are performed using a series of seven increasing verifying voltages to determine whether a selected memory cell such as C(m,n) has been successfully programmed to a state corresponding to one of threshold voltage distributions L0 through L7 in FIG. 2B.

If a memory cell C(m,n) has reached its target programming state, it is inhibited and will not be programmed any further by biasing an inhibit voltage to the bitline $BL_n$ coupled to the memory cell C(m,n). Following the sensing operation, an additional programming pulse is applied if there are still memory cells having not completed programming. This process of applying programming pulses followed by performing the sensing operation continues until all the selected memory cells have reached their target programming states. When a maximum number of programming pulses have been applied and some selected memory cells still have not completed programming, those memory cells would be designated as defective memory cells.

Also, in FIG. 1, a pass voltage is applied to each unselected wordline, for example, wordlines $WL_1$ to $WL_M$ except $WL_m$. The pass voltages applied may be different on different wordlines. A wordline $WL_{m-1}$ adjacent to the selected wordline $WL_m$ may have a pass voltage of 9V and the other wordlines may have pass voltage of 8V. The pass voltages are always low enough to not initiate programming of memory cells. Also, an inhibit voltage is applied to the bitlines which are not coupled to the memory cell strings having memory cells selected for programming. During the programming operation, alternate bitlines can be activated or deactivated for programming. For example, even number bitlines such as $BL_2$, $BL_4$ . . . etc, can be activated for programming memory cells coupled to these bitlines while the odd numbered bitlines such as $BL_1$, $BL_3$ . . . etc., are deactivated from programming memory cells coupled to these bitlines. A subsequent programming operation can then deactivate the even number bitlines and activate the odd number bitlines.

The time required to perform programming operations using the ISPP scheme of FIG. 3A tends to increase proportionally according to the number of states of the memory cells. Furthermore, in these programming operations, verification operations tend to occupy a large part of the total programming time. Thus, a flash memory device needs a verification scheme that reduces the verification time even where the number of program states of the selected memory cells is relatively large.

Figure 4:
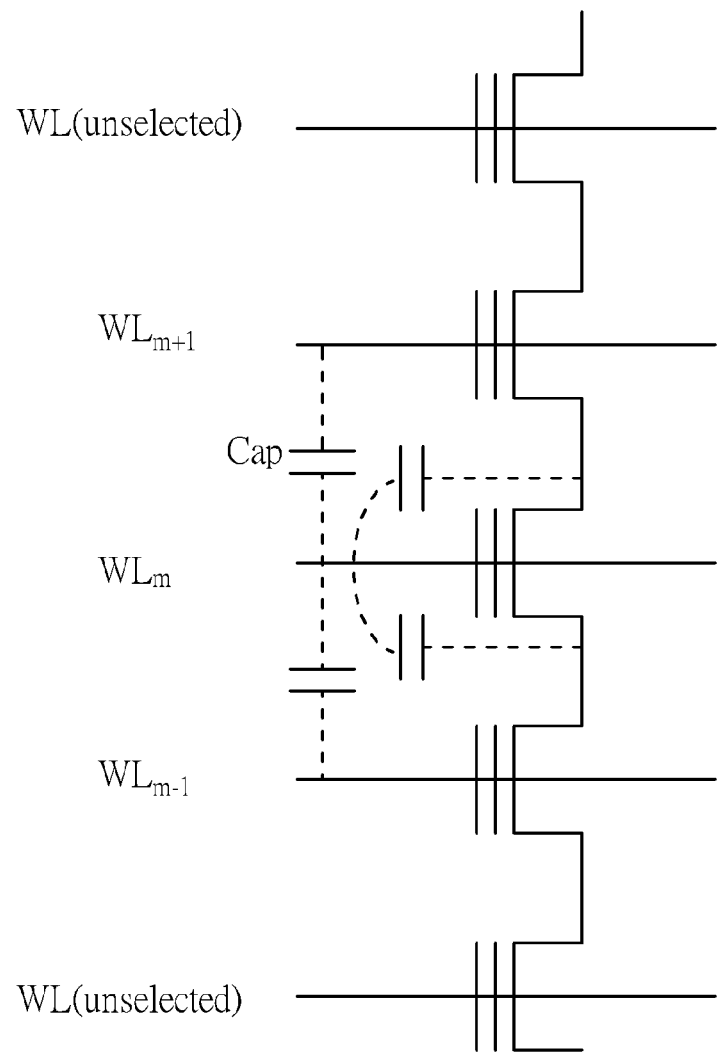
FIG. 4 is a diagram of a string of memory cells implemented in an embodiment.
Figure 5:
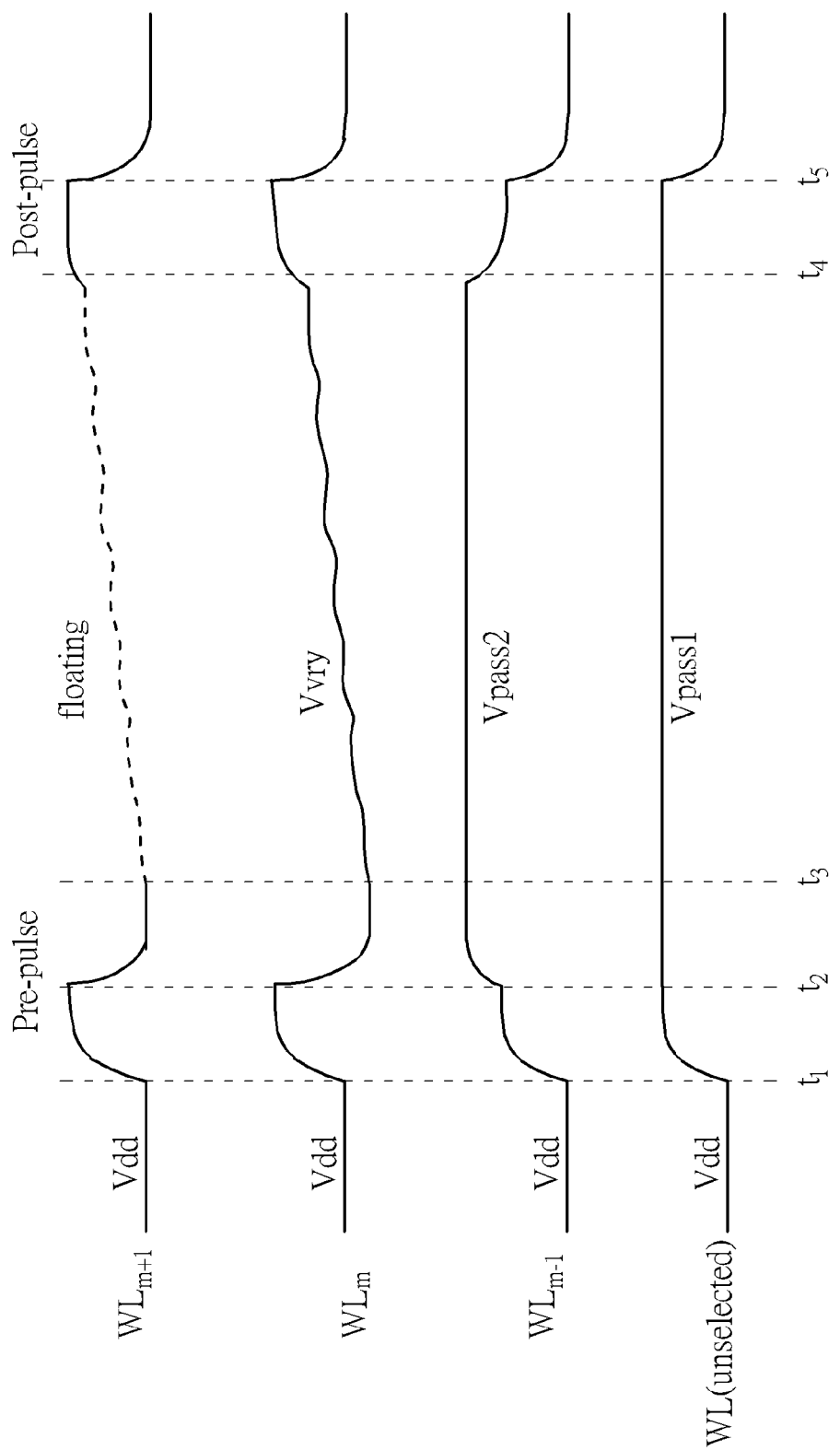
FIG. 5 illustrates a verification scheme of the programming method of an embodiment.

The following descriptions refer to FIGS. 4 and 5. FIG. 4 is a diagram of a string of memory cells implemented in an embodiment of present disclosure. FIG. 5 illustrates a verification scheme of the programming method of an embodiment of the present disclosure. In the verification operation, all the wordlines $WL_1$ to $WL_M$ start with a system voltage Vdd. At time t1, a pre-pulse voltage is applied to the selected wordline $WL_m$ and the first adjacent wordline $WL_{m+1}$. Also a first pass voltage Vpass1 is applied to the second adjacent wordline $WL_{m-1}$ and the unselected wordlines (all wordlines except $WL_m$, $WL_{m+1}$). At time t2 the selected wordline $WL_m$ and the first adjacent wordline $WL_{m+1}$ begin to discharge. A second pass voltage Vpass2 is applied to the second adjacent wordline $WL_{m-1}$. The remaining unselected wordlines are maintained at the level of the first pass voltage Vpass1. At time t3, a series of incremental verifying voltages Vvry are applied to the selected wordline $WL_m$. in this case, seven verifying voltages are applied. Also, when the voltage on the first adjacent wordline $WL_{m+1}$ drops to the system voltage Vdd, a floating voltage is applied to the first adjacent wordline $WL_{m+1}$. The voltage on the second adjacent wordline $WL_{m+1}$ is maintained at the second pass voltage Vpass2, and the voltage on the remaining unselected wordlines is maintained at the first pass voltage Vpass1. At time t4, a post-pulse voltage is applied to the selected wordline $WL_m$ and the first adjacent wordline $WL_{m+1}$. The second adjacent wordline $WL_{m-1}$ is discharged to the level of the first pass voltage Vpass1 and the voltage on the remaining unselected wordline is maintained at the first pass voltage Vpass1. At time t5, all wordlines, including $WL_m$, $WL_{m-1}$, and $WL_{m-1}$, are discharged to the level of the system voltage Vdd, thus finishing the verification operation. When the verifying voltage Vvry is applied at the selected wordline $WL_m$, the memory cells associated with the first adjacent wordline $WL_{m+1}$ is still in the erase state, thus applying the floating voltage on the first adjacent wordline $WL_{m+1}$ would not affect the subsequent programming operation. Since the second adjacent wordline $WL_{m-1}$ may no longer be in the erase state, a floating voltage should not be applied to the second adjacent wordline $WL_{m-1}$ to avoid altering the programmed cells therein. Further, during the verification operation, the floating voltage is raised by the coupling effect of the parasitic capacitor Cap between the selected wordline $WL_m$ and the first adjacent wordline $WL_{m+1}$.

Figure 6A:
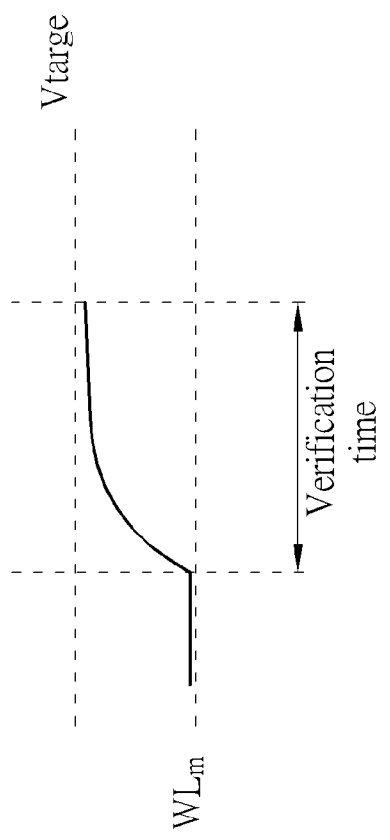
FIG. 6A is a diagram that shows the verification time of the prior art.
Figure 6B:
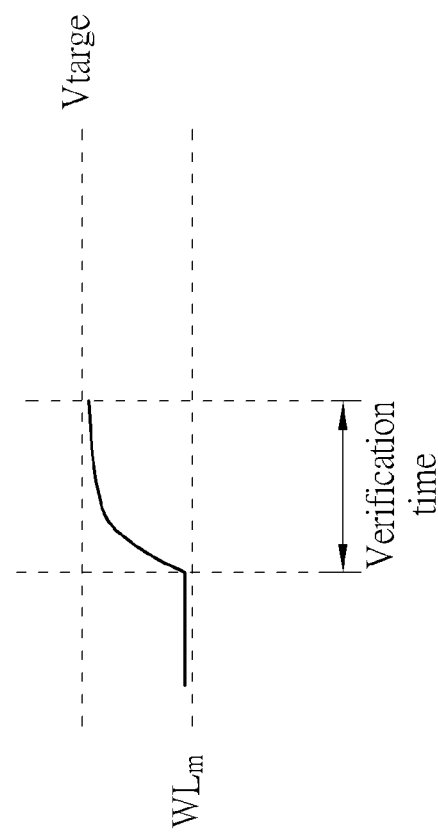
FIG. 6B is a diagram that shows the verification time of an embodiment.

FIG. 6A is a diagram that shows the verifying voltage set up time of the prior art. FIG. 6B is a diagram that shows the verifying voltage set up time of an embodiment of present disclosure. As illustrated in the figures, the method of the embodiment requires less time to reach a target verifying voltage Vtarget than the prior art. The parasitic capacitance Cap between the wordlines in FIG. 4 such as $WL_m$, $WL_{m+1}$, and $WL_{m-1}$, would influence the voltage charge time on those wordlines. When applying the floating voltage to the first adjacent wordline $WL_{m+1}$, the influence of the parasitic capacitance Cap is reduced, so the ramp up time for the verifying voltage to reach the target verifying voltage Vtarget is shortened. Therefore, it can improve the overall programming performance. Also, by applying the floating voltage to the first adjacent wordline $WL_{m+1}$, the power consumption of the circuit can be reduced to some degree. Furthermore, the method can be implemented without the need for additional circuits adding complexity to the design and manufacturing.

Figure 7:
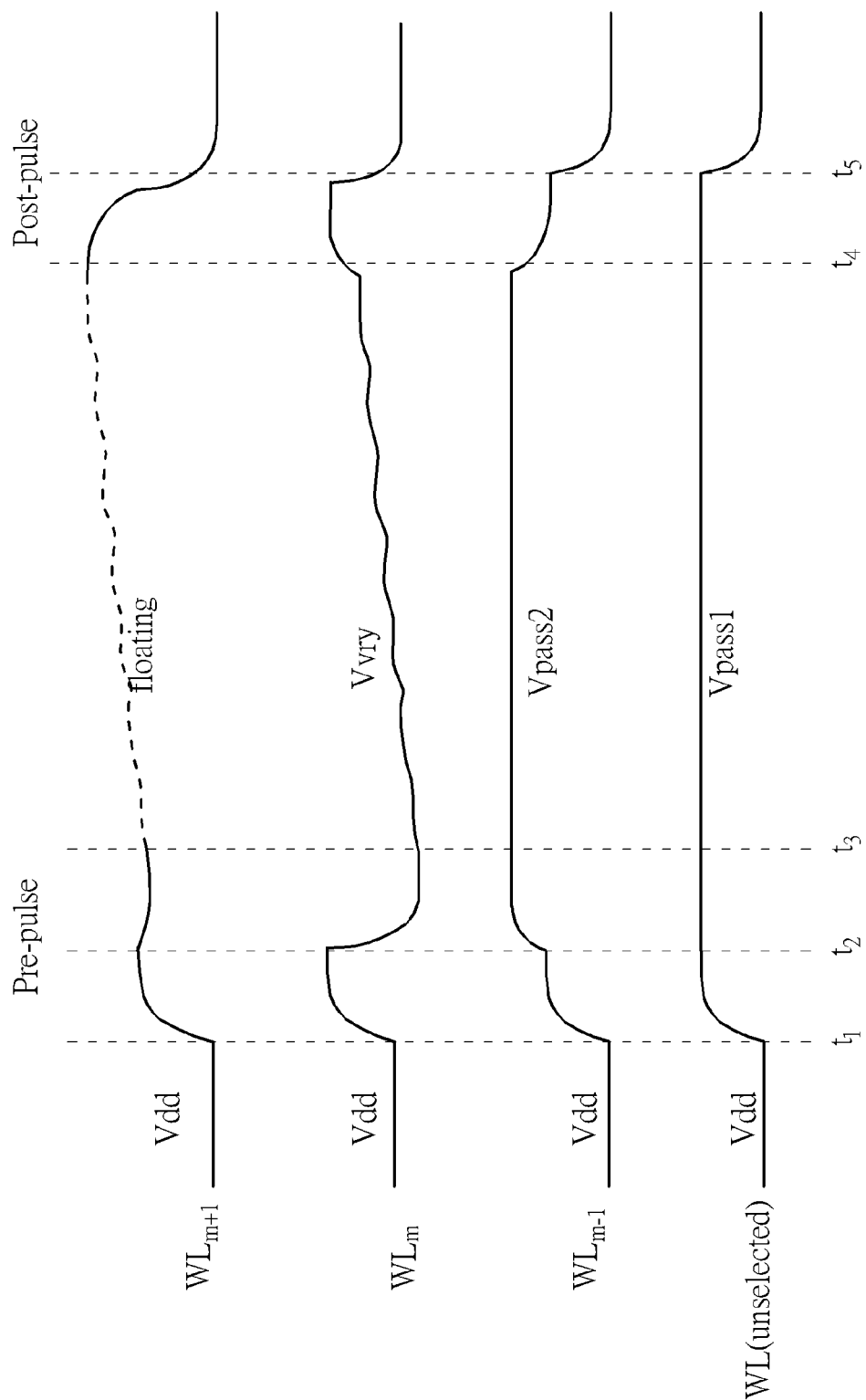
FIG. 7 illustrates a verification scheme of the programming method of an embodiment.

FIG. 7 illustrates a verification scheme of the programming method of another embodiment of the present disclosure. The verification operation illustrated in FIG. 7 is mostly similar to the illustration in FIG. 5 except that the floating voltage is applied to the first adjacent wordline $WL_{m+1}$ immediately at time t2. The floating voltage is maintained on the first adjacent wordline $WL_{m+1}$ until time t4. The rest of the operation is substantially the same as the diagram shown in FIG. 5.

Figure 8:
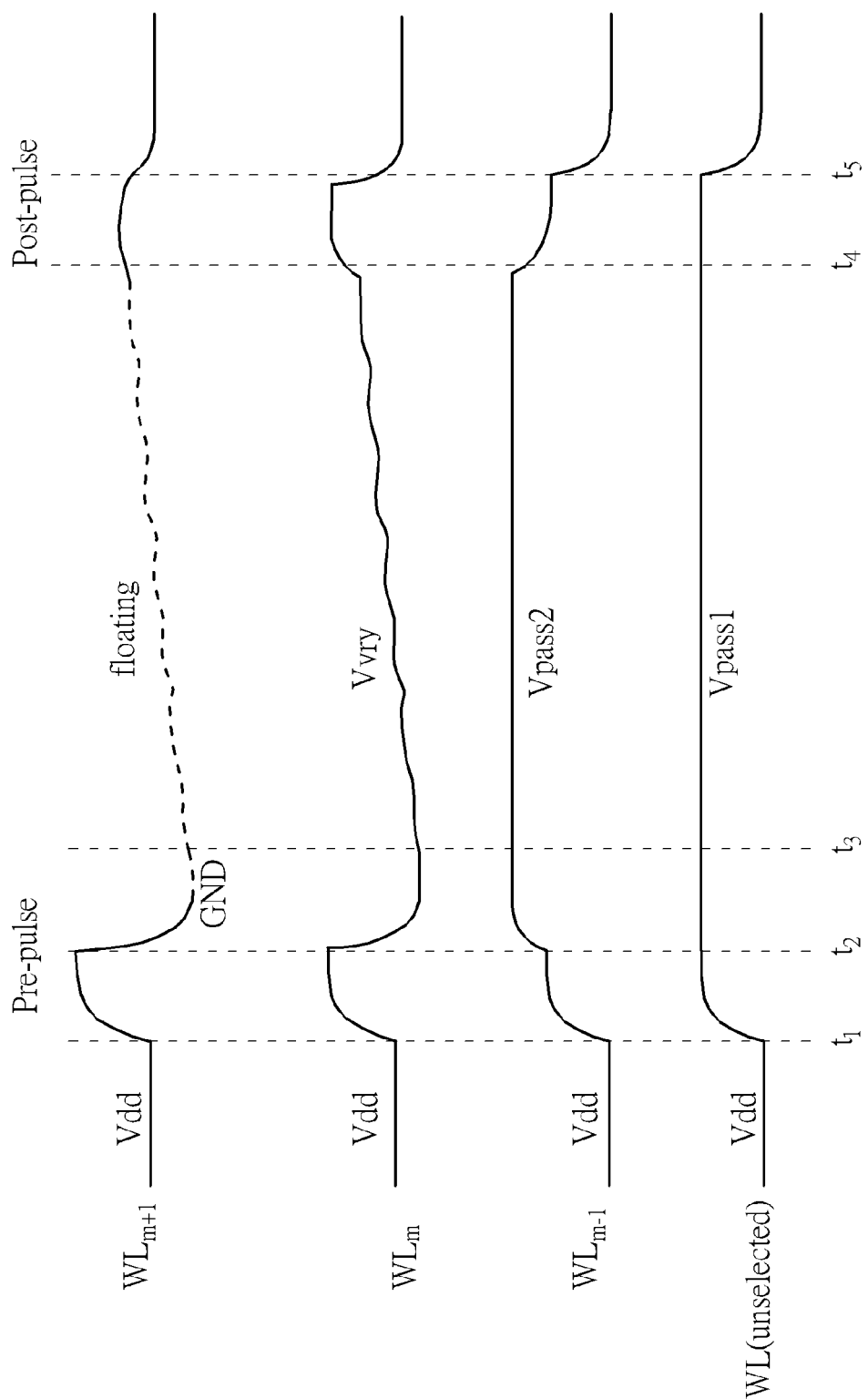
FIG. 8 illustrates a verification scheme of the programming method of an embodiment.

FIG. 8 illustrates a verification scheme of the programming method of yet another embodiment of the present disclosure. The verification operation illustrated in FIG. 8 is mostly similar to the illustration in FIG. 5 with except that the floating voltage is applied to the first adjacent wordline $WL_{m+1}$ when the voltage on the first adjacent wordline $WL_{m+1}$ drops to the ground voltage GND at time t3. The floating voltage is maintained on the first adjacent wordline $WL_{m+1}$ until time t4. The rest of the operation is substantially the same as the diagram shown in FIG. 5.

Figure 9:
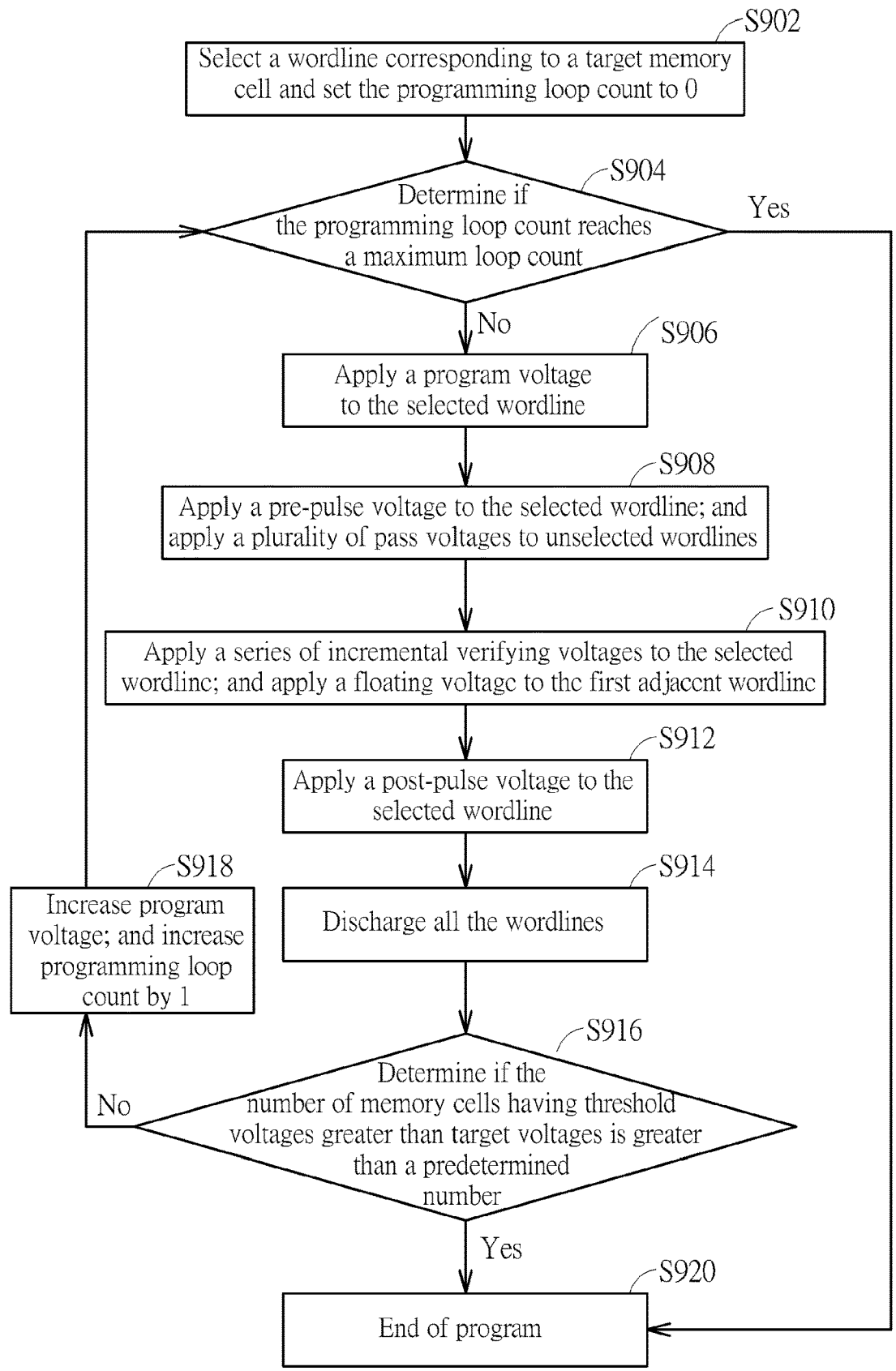
FIG. 9 is a flowchart of a method for programming the flash memory device.

FIG. 9 is a flowchart of a method 900 for programming a flash memory device. The method incorporates the verification operations previously described. The method 900 includes:

S902: Select a wordline corresponding to a target memory cell and set the programming loop count to 0;

S904: Determine if the programming loop count reaches a maximum loop count; if so, proceed to step S920; else proceed to S906;

S906: Apply a program voltage to the selected wordline;

S908: Apply a pre-pulse voltage to the selected wordline; and apply a plurality of pass voltages to unselected wordlines;

S910: Apply a series of incremental verifying voltages to the selected wordline; and apply a floating voltage to the first adjacent wordline;

S912: Apply a post-pulse voltage to the selected wordline;

S914: Discharge all the wordlines;

S916: Determine if the number of memory cells having threshold voltages greater than target voltages is greater than a predetermined number; if so proceed to step 920; else proceed to step S918;

S918: Increase program voltage; and increase programming loop count by 1; proceed to step S904; and S920: End of program.

In summary, the programming method of the embodiment includes applying the floating voltage to an adjacent wordline nearest to and programmed after the selected wordline. The influence of the parasitic capacitance between the wordlines can be reduced. Therefore, it can effectively reduce the ramp up time for the verifying voltage, thus reducing the verification time and improving the overall programming performance. Also, this method can reduce the power consumption of the circuit to some degree. Furthermore, the method can be implemented without additional circuits adding complexity to the design and manufacturing.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory device, comprising:
   a first memory cell;
   a second memory cell;
   a first word line coupled to the first memory cell and configured to:
      receive a program voltage during a first time period; and
      receive a verifying voltage during a second time period after the first time period; and
   a second word line coupled to the second memory cell and adjacent to the first word line and, the second word line configured to receive a pre-pulse voltage during a third time period between the first and the second time periods.

2. The memory device of claim 1, wherein the first word line is immediately and physically adjacent to the second word line.

3. The memory device of claim 1, wherein the second word line is further configured to receive a floating voltage during a fourth time period after the third time period.

4. The memory device of claim 3, wherein the fourth time period at least partially overlaps the second time period.

5. The memory device of claim 4, wherein the fourth and second time periods end at a same time.

6. The memory device of claim 4, wherein the fourth and second time periods start at a same time.

7. The memory device of claim 4, wherein the fourth time period starts earlier than the second time period.

8. The memory device of claim 3, wherein the second word line is further configured to receive a post-pulse voltage during a fifth time period after the fourth time period.

9. The memory device of claim 1, further comprising:
   a third memory cell; and
   a third word line coupled to the third memory cell and configured to receive a pass voltage during the second time period.

10. The memory device of claim 9, wherein the third word line is immediately and physically adjacent to the second word line.

11. A memory device, comprising:
    a first memory cell;
    a second memory cell;
    a first word line coupled to the first memory cell;
    a second word line coupled to the second memory cell and adjacent to the first word line; and
    a control circuit coupled to the first and second word lines and configured to:
       apply a program voltage on the first word line during a first time period;
       apply a verifying voltage on the first word line during a second time period after the first time period; and
       apply a pre-pulse voltage on the second word line during a third time period between the first and the second time periods.

12. The memory device of claim 11, wherein the first word line is immediately and physically adjacent to the second word line.

13. The memory device of claim 11, wherein the control circuit is further configured to apply a floating voltage on the second word line during a fourth time period after the third time period.

14. The memory device of claim 13, wherein the fourth time period at least partially overlaps the second time period.

15. The memory device of claim 14, wherein the fourth and second time periods end at a same time.

16. The memory device of claim 14, wherein the fourth and second time periods start at a same time.

17. The memory device of claim 14, wherein the fourth time period starts earlier than the second time period.

18. A memory device, comprising:
    a first memory cell;
    a second memory cell;
    a first word line coupled to the first memory cell and configured to receive a verifying voltage during a first time period; and
    a second word line coupled to the second memory cell,
    wherein the second word line is configured to receive a voltage to offset a parasitic voltage caused by a parasitic capacitance between the first and second word lines during the first time period.

19. The memory device of claim 18, wherein the first word line is immediately and physically adjacent to the second word line.

20. The memory device of claim 18, wherein the second word line is configured to receive a floating voltage during a second time period at least partially overlapping the first time period.

* * * * *